United States Patent
Krall et al.

(10) Patent No.: US 9,865,672 B2
(45) Date of Patent: Jan. 9, 2018

(54) MACRO-IMAGE OLED LIGHTING SYSTEM

(71) Applicant: UNIVERSAL DISPLAY CORPORATION, Ewing, NJ (US)

(72) Inventors: Emory Krall, Philadelphia, PA (US); Huiqing Pang, Bellevue, WA (US); Jason Paynter, Bristol, PA (US); Jeffrey Silvernail, Yardley, PA (US); Ruiqing Ma, Morristown, NJ (US)

(73) Assignee: UNIVERSAL DISPLAY CORPORATION, Ewing, NJ (US)

( * ) Notice: Subject to any disclaimer, the term of this patent is extended or adjusted under 35 U.S.C. 154(b) by 65 days.

(21) Appl. No.: 14/278,150

(22) Filed: May 15, 2014

(65) Prior Publication Data
US 2014/0340901 A1  Nov. 20, 2014

Related U.S. Application Data

(60) Provisional application No. 61/823,481, filed on May 15, 2013.

(51) Int. Cl.
*H01L 27/32* (2006.01)
*H01L 27/28* (2006.01)
*H01L 25/04* (2014.01)

(52) U.S. Cl.
CPC ........ *H01L 27/3293* (2013.01); *H01L 25/047* (2013.01); *H01L 27/3239* (2013.01); *H01L 2924/0002* (2013.01); *Y10T 29/41* (2015.01)

(58) Field of Classification Search
CPC ........ G02F 13/00–13/005; G02F 13/04; G02F 13/08–13/10; G02F 13/20–13/22;
(Continued)

(56) References Cited

U.S. PATENT DOCUMENTS 4,769,292 A    9/1988 Tang et al.
5,247,190 A    9/1993 Friend et al.
(Continued)

FOREIGN PATENT DOCUMENTS

WO    2008057394    5/2008
WO    2010011390    1/2010

OTHER PUBLICATIONS

Baldo, et al., "Highly efficient phosphorescent emission from organic electroluminescent devices", Nature, vol. 395, pp. 151-154, 1998.

(Continued)

*Primary Examiner* — Anh Mai
*Assistant Examiner* — Nathaniel Lee
(74) *Attorney, Agent, or Firm* — Morris & Kamlay LLP

(57) ABSTRACT

Techniques to fabricate and assemble a lighting system including multiple patterned OLED lighting panels to form a high-resolution macro image are provided. An image to be displayed is determined and divided into multiple portions. Patterned static OLED lighting panels that display each portion of the image are fabricated and assembled into a fixture to form a macro-image lighting system. The fixture may removably receive and hold individual panels, such that each panel may be replaced if any malfunction occurs. Each of the patterned OLED panels may be individually driven through an electrical connection within the fixture so as to be operated at substantially the same brightness and/or same chromaticity.

22 Claims, 15 Drawing Sheets

(58) Field of Classification Search
CPC .... G09F 2013/222–2013/227; H01L 27/3293; H01L 27/3237
See application file for complete search history.

(56) References Cited

U.S. PATENT DOCUMENTS

| | | | |
|---|---|---|---|
| 5,703,436 A | 12/1997 | Forrest et al. | |
| 5,707,745 A | 1/1998 | Forrest et al. | |
| 5,834,893 A | 11/1998 | Bulovic et al. | |
| 5,844,363 A | 12/1998 | Gu et al. | |
| 6,013,982 A | 1/2000 | Thompson et al. | |
| 6,087,196 A | 7/2000 | Sturm et al. | |
| 6,091,195 A | 7/2000 | Forrest et al. | |
| 6,097,147 A | 8/2000 | Baldo et al. | |
| 6,294,398 B1 | 9/2001 | Kim et al. | |
| 6,303,238 B1 | 10/2001 | Thompson et al. | |
| 6,337,102 B1 | 1/2002 | Forrest et al. | |
| 6,468,819 B1 | 10/2002 | Kim et al. | |
| 6,565,231 B1 | 5/2003 | Cok | |
| 7,279,704 B2 | 10/2007 | Walters et al. | |
| 7,431,968 B1 | 10/2008 | Shtein et al. | |
| 7,968,146 B2 | 6/2011 | Wagner et al. | |
| 2003/0230980 A1 | 12/2003 | Forrest et al. | |
| 2004/0174116 A1 | 9/2004 | Lu et al. | |
| 2005/0178034 A1* | 8/2005 | Schubert | G09F 9/33 40/605 |
| 2007/0184745 A1* | 8/2007 | Griffin | C23C 14/042 445/24 |
| 2010/0045189 A1 | 2/2010 | Storch et al. | |
| 2010/0046210 A1* | 2/2010 | Mathai | H01L 51/52 362/147 |
| 2010/0141135 A1* | 6/2010 | Kase | G02F 1/133351 313/512 |
| 2011/0233592 A1 | 9/2011 | Verschuren et al. | |

OTHER PUBLICATIONS

Baldo, et al., "Very high-efficiency green organic light-emitting devices based on electrophosphorescence", Applied Physics Letters, vol. 75, No. 1, pp. 4-6, Jul. 5, 1999.

* cited by examiner

Anode

Organic

Cathode

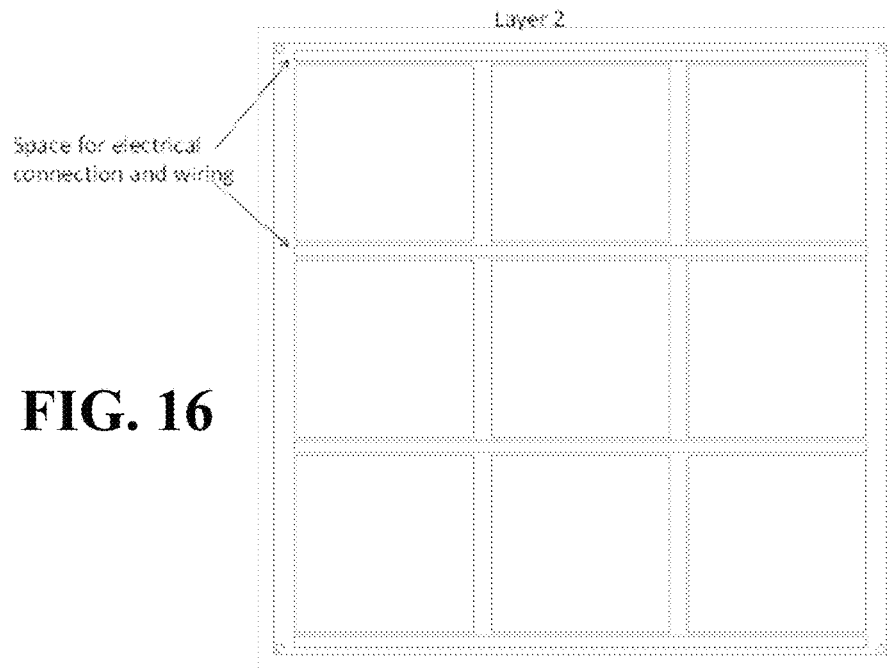
FIG. 16
FIG. 17
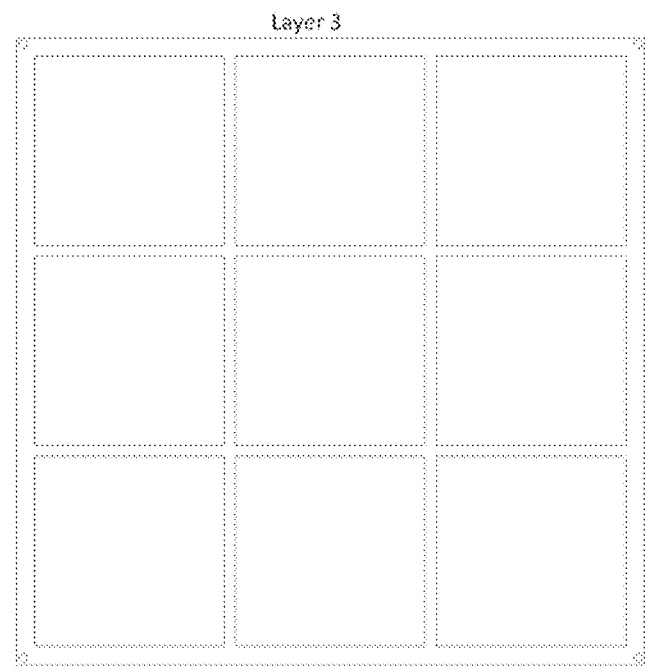

MACRO-IMAGE OLED LIGHTING SYSTEM

PRIORITY

This application claims priority to U.S. Provisional Application No. 61/823,481, filed May 15, 2013, the disclosure of which is incorporated by reference in its entirety.

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices (OLEDs) and, more specifically, illumination that include multiple static OLEDs that can be arranged to form a macro image.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the following structure:

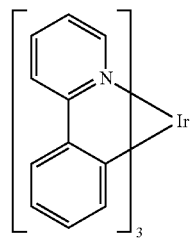

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher"

HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

OLED devices including multiple static OLED panels that can be arranged to form a macro image within a fixture, and techniques for fabricating the same, are provided. In an embodiment, a technique for fabricating a device includes obtaining an image; generating a plurality of image portions of the image, the plurality of image portions forming the image, and at least two of which are non-identical; fabricating static OLED panels, each of which is configured to display one of the plurality of image portions and has at least one pixel, wherein, for each OLED panel, all the pixels in the OLED panel share a common anode and a common cathode; and placing each OLED panel in a fixture in an arrangement configured to reproduce the image. Each of the static OLED panels may display one of the plurality of image portions when electrical power is applied to the static OLED panel. The fixture may include electrical connections, each of which provides electrical power to one of the OLED panels when the panels are disposed within the fixture. The panels may be individually addressable. The OLED panels may be flexible, transparent, and/or bezel-less.

In an embodiment, the OLED panels may be fabricated by depositing layers including an anode, a cathode, and an organic emissive layer, over a substrate. A common mask may be used to fabricate at least one layer for each of the OLED panels. Each OLED panel may be fabricated individually or multiple panels may be fabricated on a common substrate, after which the panels are separated by cutting or otherwise separating the common substrate.

In an embodiment, the OLED panels may be essentially the same shape and area. In an embodiment, at least one OLED panel has a different area than at least one other panel.

In an embodiment, a desired pattern for OLED panels may be formed by disposing a plurality of insulating dots within the at least one OLED panel to form the image portion. The insulating dots may be patterned using a photolithographic technique such as via a photoresistive material and/or a printed plastic sheet that defines the position of each of the plurality of insulating dots.

In an embodiment, a desired pattern for OLED panels may be formed by fabricating a plurality of pixels in the OLED, each of which is electrically connected to a fuse that limits current to the pixel, and applying energy to selected fuses to cause the pixels to be essentially non-conductive.

In an embodiment, the OLED panels may be individually addressable. The driving parameters for individual OLEDs may be adjusted to achieve a uniform luminance and/or chromaticity with at least a second OLED panel of the plurality of OLED panels.

In an embodiment, an OLED system is provided that includes a plurality of OLED panels disposed within a common fixture, each of which displays a static sub-image, wherein all pixels within each OLED panel of the plurality of OLED panels share a common anode and a common cathode, and wherein at least one OLED panel is configured to display a different sub-image than at least one other OLED panel; wherein the sub-images provide the primary image when the OLED panels are disposed within the common fixture. The OLED panels may be individually addressable via the common fixture. The system may further include a controller configured to drive the plurality of OLED panels at a uniform luminance.

BRIEF DESCRIPTION OF THE DRAWINGS

FIGS. 15-17 show separate layers of the fixture shown in FIG. 14.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
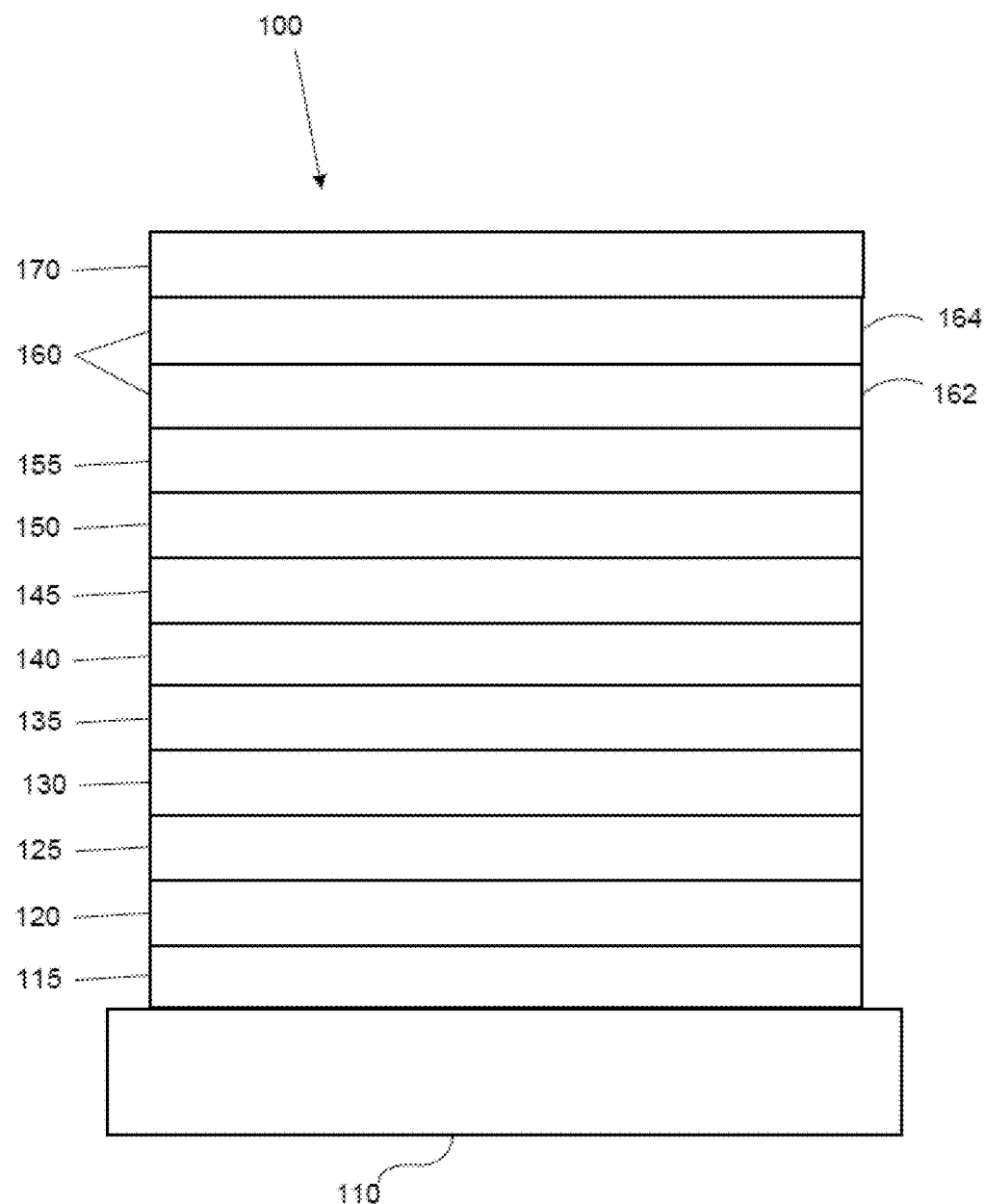
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
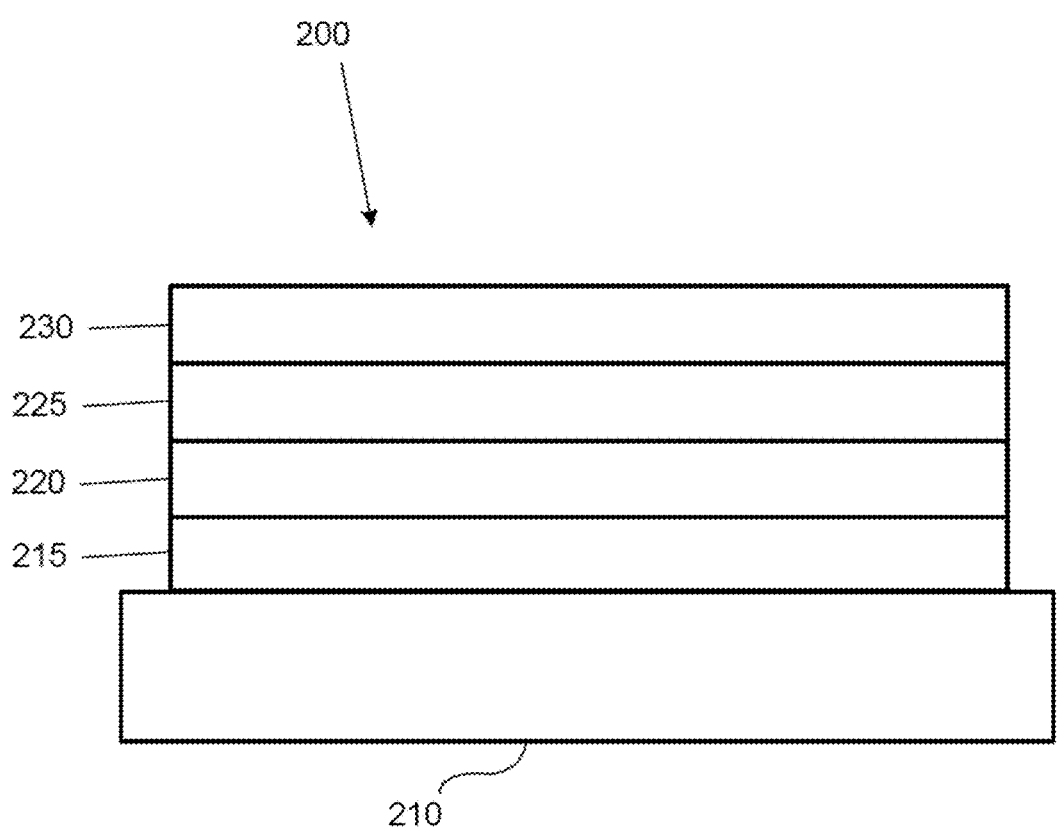
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJP. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention may be incorporated into a wide variety of consumer products, including flat panel displays, computer monitors, medical monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

Multiple OLED panels may be tiled to form a larger device, for example to provide a large display or luminaire. Such a configuration may be preferable to a single large device, because it may be less expensive to manufacture multiple smaller devices rather than one large device. Moreover, some tiling fixture may also provide the advantage that if one of the smaller OLED light panel fails, thereby affecting a portion of a luminaire, it may be possible to replace only that failed panel. In contrast, if a single large OLED device is used, the entire device may need to be replaced if there is a failure in only a portion thereof. A larger device may be more expensive than the smaller devices due to the additional materials and complexity of manufacturing. For example, U.S. Pat. No. 6,565,231 describes a lighting fixture for removably receiving and holding multiple light sources and to provide electrical connection to external power source. However, such arrangements there provide no relationship among the OLED panels, i.e., they are not arranged or fabricated to form a specific image. Such OLED panels may all be the same and may use the same masks, which may be relatively simple to manufacture. In contrast, embodiments of the present subject matter may include OLED panels having different patterns from each other, and the patterns may be closely related to each other. Such an arrangement may be more complex to arrange and/or fabricate than simply assembling multiple light sources, due to fact that the fabrication of each patterned OLED panel may require different masks. In addition, the panels may also need to be arranged, i.e., assembled, in a specific way to display the desired pattern or image, which may require extra electrical components.

Various techniques may be used to assemble OLED panels with different active areas into a device. Typically one or more controllers are used to selectively drive the panels, and a coupler is used to electrically couple the devices to external power supply. Such a configuration is described, for example, in U.S. Patent Pub. No. 2010/0045189. However, such systems typically are constructed to control panels of different colors to produce white light, with the controller configured to tune the color or luminance of each panel to achieve the desired white emission and to enhance device lifetime. In contrast, embodiments disclosed herein may display a macro size image. Such an arrangement may be relatively more complex and/or difficult to achieve.

Another technique of producing a static image is to produce a single panel that generates the image. Examples of such techniques and systems are described, for example, in U.S. Patent Pub. No. 2011/0233592 and PCT Pub. No. WO/US2013/043197. Large-area OLED panels typically suffer from emission uniformity due to the relatively high resistance of the anode. Non-emissive metal bus lines may be integrated to reduce this issue; however, this typically affects the transparency level of the image, which may be undesirable. In contrast, embodiments disclosed herein provide lighting systems that use multiple imaged lighting panels, i.e., patterned OLED panels, to form a macro image light source, without requiring additional bus lines or similar arrangements.

In embodiments disclosed herein, a low-cost method to fabricate and assemble a lighting system including multiple patterned OLED lighting panels to form a high-resolution macro image is provided. In an embodiment, the process includes determining an image to be displayed, dividing the image into multiple portions, fabricating patterned OLED lighting panels that display each portion of the image, and assembling the panels into a fixture to form a macro-image lighting system. The fixture may provide mechanical support to the panels and electrical connection between the panels and external power source, and the fixture may be designed to removably receive and hold individual panels, such that each panel may be replaced if any malfunction occurs. Each of the patterned OLED panels may be individually driven through an electrical connection within the fixture so as to be operated at substantially the same brightness and/or same chromaticity. In an embodiment, the OLED panels may be transparent devices. In an embodiment, the OLED panels may preferably emit substantially the same color and/or luminance.

In an embodiment, one or more OLED panels used in a fixture as disclosed herein may be transparent devices. Thus, a lighting system that includes transparent panels may be used as window panes, transparent internal dividers, glass roof components, and the like. When the device is in an off state, i.e., electrical power is not applied to the panels, the lighting system may appear transparent or semi-transparent. When the device is on, i.e., electrical power is applied to one or more of the panels, the lighting system may be used as a decorative light source. Alternatively or in addition, one or more of the OLED panels may be a bottom emission or top emission devices where the device appears to be reflective. A lighting system that includes such reflective panels may be used as a decorative light-mirror. When the device is off, the lighting system functions as a mirror; while the device is on, it emits an illuminated image.

Generally, a process for constructing a device including multiple OLED panels as disclosed herein may include obtaining an image, generating multiple portions of the image, at least two of which are non-identical, i.e., include separate portions of the image that are not the same. Static OLED panels may then be fabricated, each of which is configured to display one of the portions of the image and includes at least one pixel. In contrast to a full-color display or similar device, as used herein a "static" OLED panel is one that is configured to display a fixed image when electrical power is applied, and that does not display an image when power is not applied. For each OLED panel, all pixels in the OLED panel may share a common anode and cathode. The OLED panels may then be placed into a fixture, arranged so as to reproduce the original image.

Figure 3:
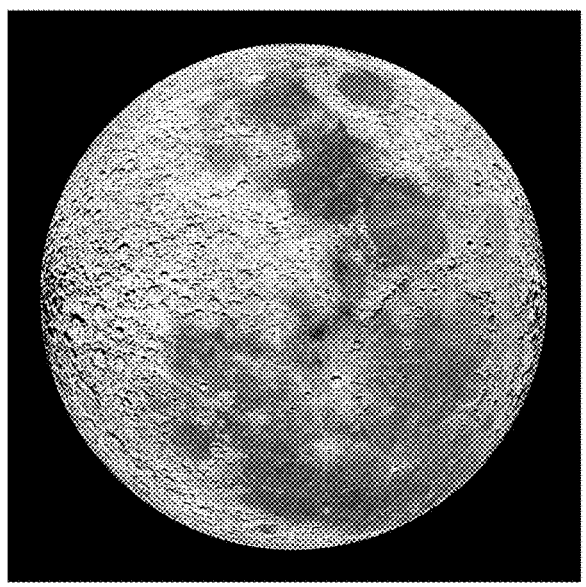
FIG. 3 shows an example of a single image that is to be displayed according to an embodiment.

More specifically, in an embodiment, an image to be displayed may be determined. The image may be requested by a specific customer, specified by an internal designer, or may come from any other source. An example source image of the moon is shown in FIG. 3.

Figure 4:
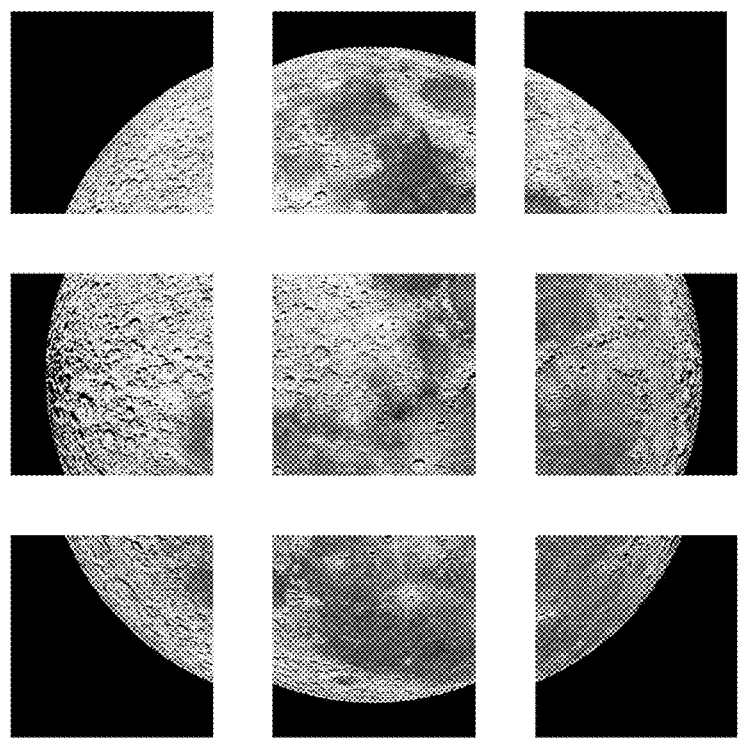
FIGS. 4 and 5 show example arrangements of a single image divided into image portions according to an embodiment.
Figure 5:
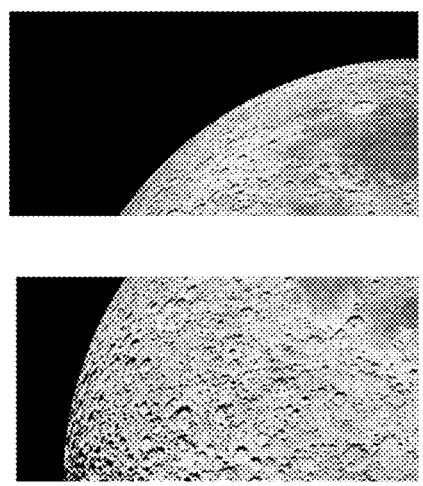

The original selected image may then be divided into multiple portions, as shown in FIG. 4. In this example, the original image has been divided into nine portions of equal size. An original image need not be divided into regular portions of equal size and, in some cases, only a portion of an original image may be used. For example, referring to the example image shown in FIG. 1, it may be desired to use only the upper-left portion of the image in a particular arrangement, in which "landscape" oriented rectangular portions are desired. FIG. 5 shows an example of such a configuration. More generally, the original image may be divided into any number of portions having any desired shapes. For example, the single image may be divided to equal sized hexagons, triangles, or any shape that may form a closely packed pattern. The single image also may be divided into various non-uniform or different shapes and/or sizes, such as a tangram-like pattern. In some cases, it may be preferable for the size and shape of the portions to be the same, to allow for more efficient fabrication of universal masks that can be used for the panels. In an embodiment, each static OLED panel may have essentially the same shape and area. As used herein, two OLED panels have essentially the same shape and size if the difference in appearance of the panel would not be discernable to the human eye, for example if the OLED panels have the same geometric shape and areas that vary by not more than 5%. The number of portions may also vary. In particular, the larger the number, the larger the final lighting system will be, assuming the size of individual panels is the same. For example, if the OLED panel to display each portion is a 6 inch square when the single image is divided into 9 portions, the final macro image may be a square having 18-inch sides, whereas if the single image is divided into 16 portions, the final macro image may measure 2 feet×2 feet. In this calculation, the additional spacing of the fixture between individual panels is neglected. The division of the image may be decided by the internal designer, or the external customer. The selection of the image and preparation of individual image portions may involve various customizations to the image, the portions of the image, the expected color, contrast, luminance, and other attributes of the image, and the like.

After portions of the image are selected, individual static OLED panels may be fabricated, with each panel corresponding to one of the portions of the image so that when electrical power is applied to the panel, the panel displays the portion of the image. Various techniques may be used to fabricate the panels. Generally, each panel may be fabricated using any known technique for fabricating a static OLED, such as previously described, in which, for each panel, an anode, cathode, and organic emissive layer are fabricated over a substrate. As an example, a technique as disclosed in PCT Pub. No. WO/US2013/043197, the disclosure of which is incorporated by reference in its entirety, may be used, in which a patterned insulator is disposed within the device. The patterned insulator prevents portions of the OLED panel from emitting, thus resulting in the desired image portion. Other techniques as disclosed herein may be used to fabricate the static OLED panels.

Figure 6:
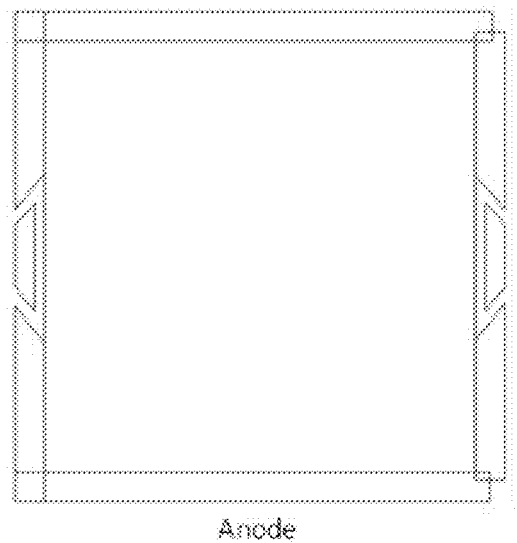
FIGS. 6-8 show example anode, organic and cathode arrangements, respectively, according to an embodiment.
Figure 7:
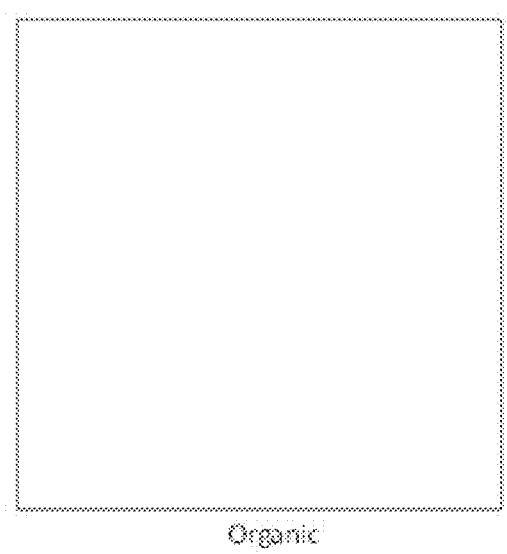
Figure 8:
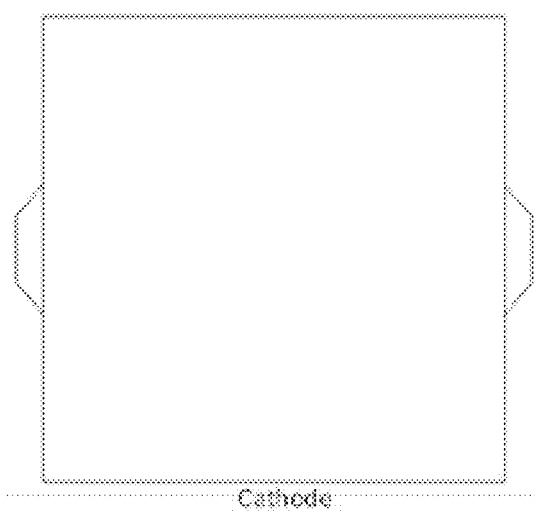
Figure 9:
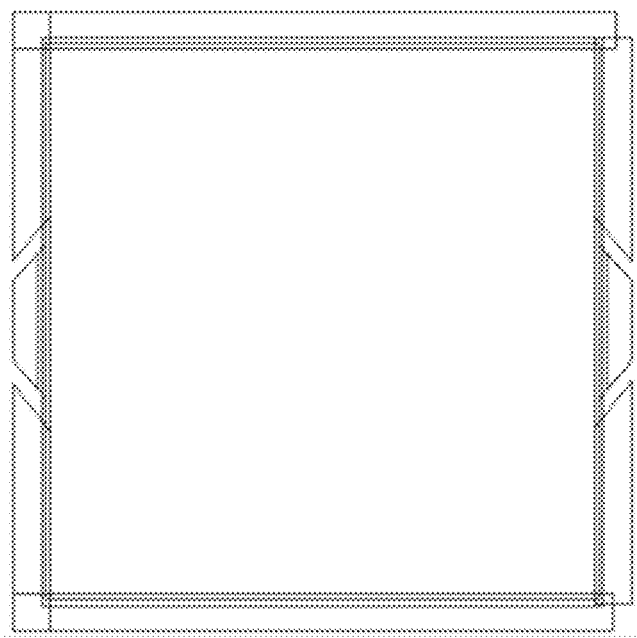
FIG. 9 shows an example arrangement of overlapping anode, organic and cathode layers according to an embodiment.

In an embodiment, masks may be used to fabricate one or more layers of each static OLED. To simplify the fabrication process and/or reduce manufacturing costs, layouts for the anodes, organic emissive layers, and/or cathodes of the static OLED panels may all be the same. In particular, anode, organic and cathode layers all may be disposed through shadow masks. The same shadow masks for the anode, organic, and cathode layers may be used for multiple static OLED panels even though the patterned images may be different. For example, one or more of the layers in each OLED panel may use the same mask, and the individual patterns may be achieved by using a patterned insulator layer. FIGS. 6-8 show examples mask configurations for square panels for the anode, organic and cathode mask layouts, respectively. FIG. 9 shows the resulting overlap arrangement of the three layers. Additional masks for may be used for other layers in the static OLED panels, such as contacts, encapsulation layers, or the like.

Figure 10:
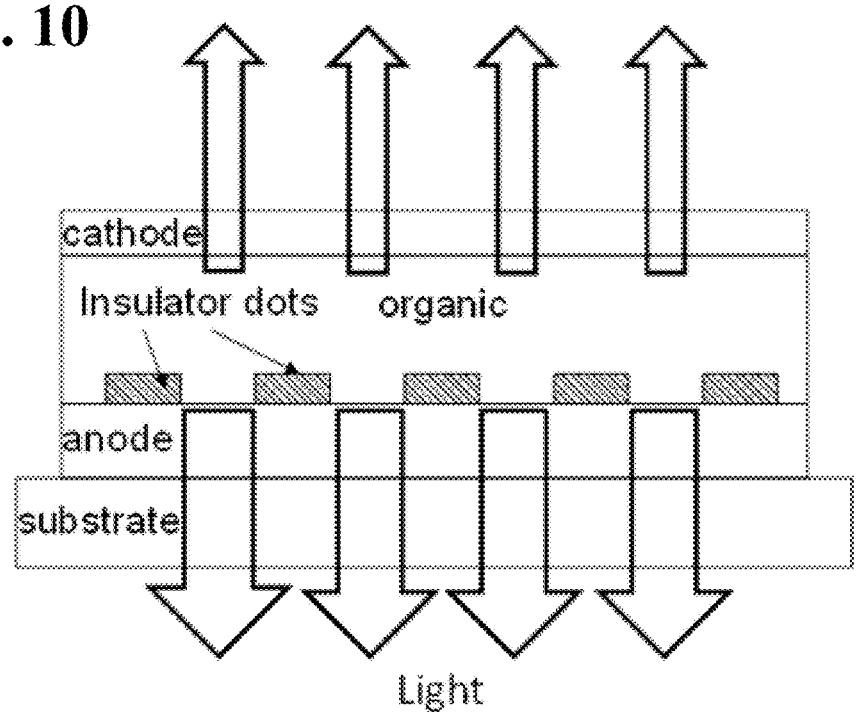
FIG. 10 shows an example device structure of a patterned OLED according to an embodiment.

As previously described, one technique for achieving individual image portions when common masks are used for multiple static OLED panels may be to incorporate a patterned layer of insulator regions, which may be referred to as "insulating dots", within the device. FIG. 10 shows an example structure of such a device. The insulator dots prevent emission by the OLED panel in the regions where the dots are located. When electrical power is provided to the static OLED panel, the uninsulated regions of the panel emit light, thus allowing for a desired image pattern to be created for each OLED panel. Insulating dots may be fabricated, for example, by using a photolithographic technique. As a specific example, a layer including a photolithographic material may be applied over a partially-completed OLED panel, in a pattern based on the desired image portion for the panel. The appropriate light may then be applied to the layer to alter or remove the photolithographic material, thus producing the insulating dots in the pattern of the desired image portion. As another example, insulating dots may be applied via a printed plastic sheet used as a photo mask. Such a photo mask may be relatively low cost, easy to fabricate, high resolution, and/or highly customizable compared to conventional photo-resist techniques.

Another technique for achieving a desired pattern in an OLED panel is to fabricate the panel to have multiple pixels, each of which is electrically connected to a fuse. The fuse limits current through the pixel in a manner commonly known for fuses in the art and in similar contexts. Techniques and systems for fabricating OLED panels are further described in U.S. Pub. No. 2012/0181933, the disclosure of which is incorporated by reference in its entirety. To achieve a desired pattern, one or more fuses in the panel may be intentionally "opened," i.e., made essentially non-conductive. As used herein, a fuse or other component of an OLED is made essentially non-conductive if it is made to be at least $1/1000^{th}$ as conductive as it was initially. For example, energy may be applied to a fuse to "blow" or "open" the fuse, thus causing it to become essentially non-conductive. As a specific example, a UV or IR laser may be directed at individual fuses to cause the fuses to become essentially non-conductive. By making selected fuses essentially non-conductive, the associated pixels in the OLED panel will not emit light when electrical power is applied to the OLED panel, thus achieving the desired pattern.

As another example, some or all of the static OLED panels may be fabricated on a common substrate, which is then separated to form the individual OLED panels. For example, referring to the image portions shown in FIG. 5, both portions may be fabricated side-by-side on a common substrate, using any of the fabrication techniques disclosed herein. A single large mask may be used, with portions applicable to each portion, or individual masks may be used. After fabricating some or all of the layers of the OLED panels over the common substrate, the substrate may be cut or otherwise separated to produce the two OLED panels.

As another example, some or all of the static OLED panels may be fabricated by first fabricating a larger OLED panel of sufficient size to include the desired panels, and then separating portions of the larger panel to obtain the desired shapes and sizes. For example, the larger panel may be cut into multiple pieces to obtain the individual static OLED panels, using techniques known in the art. A larger image that incorporates each of the image portions associated with the individual panels may be fabricated on the larger panel. In some cases, small portions of the larger image may be lost or rendered unusable when the individual panels are separated from the larger panels. Such loss may be acceptable, for example, when the individual static OLED panels are to be placed in a fixture that includes a border between individual panels. In other cases, the larger image may include regions between the image portions that are non-emissive or that are not part of the intended image, to allow for such loss. For example, referring to the image portions shown in FIG. 5, a larger panel including both image portions and a non-image boundary between the two portions may be fabricated. When the two panels are separated, the non-image boundary may be removed as part of the separation process, thus resulting in the two panels shown in FIG. 5.

After the static OLED panels are fabricated, they may be placed in a fixture, such as a frame, mount, or similar device that is configured to hold the panels. The panels may be placed so as to recreate the complete original image. For example, a fixture configured to hold the panels shown in FIG. 4 may be configured to receive nine panels, such that when the panels shown in FIG. 4 are placed in the fixture, the complete image of the moon as shown in FIG. 3 is created. The fixture may have a border or other visible separator between panels, or it may be configured to hold the panels without an intervening border or other framing between adjacent panels. The fixture also may include one or more electrical connections, each of which is capable of providing electrical power to one of the static OLED panels. For example, a fixture may have electrical connections configured to connect to leads fabricated on the anode and cathode layers, such as via a set of masks as described with respect to FIGS. 6-9. The fixture and associated electrical connections may allow each panel in the fixture to be individually addressed, such as by providing separate control over the electrical connections made to each panel and the electrical power delivered to each panel. As previously described, this may allow the OLED panels to be driven at varying levels to achieve a uniform luminance and/or chromaticity between panels. Such adjustments may be made, for example, after the OLED panels are initially placed in the fixture, before delivering the completed luminaire to a customer. Alternatively or in addition, a fixture may include a compensator or other component that measures the output of OLED panels in the fixture, and adjusts the electrical power provided to each OLED panel to achieve uniform luminance and/or chromaticity. The fixture also may include controls that allow for adjustment of the electrical power provided to each panel subsequent to the initial fabrication and/or adjustment of the fixture.

In general, static OLED panels according to embodiments disclosed herein may include any OLED configuration and physical arrangement disclosed herein. Specifically, one or more OLED panels in a fixture as disclosed may be transparent, flexible, and/or bezel-less. Such options may allow for a high degree of flexibility in designing fixtures and OLED panels for a given physical location and arrangement.

Experimental

Figure 11:
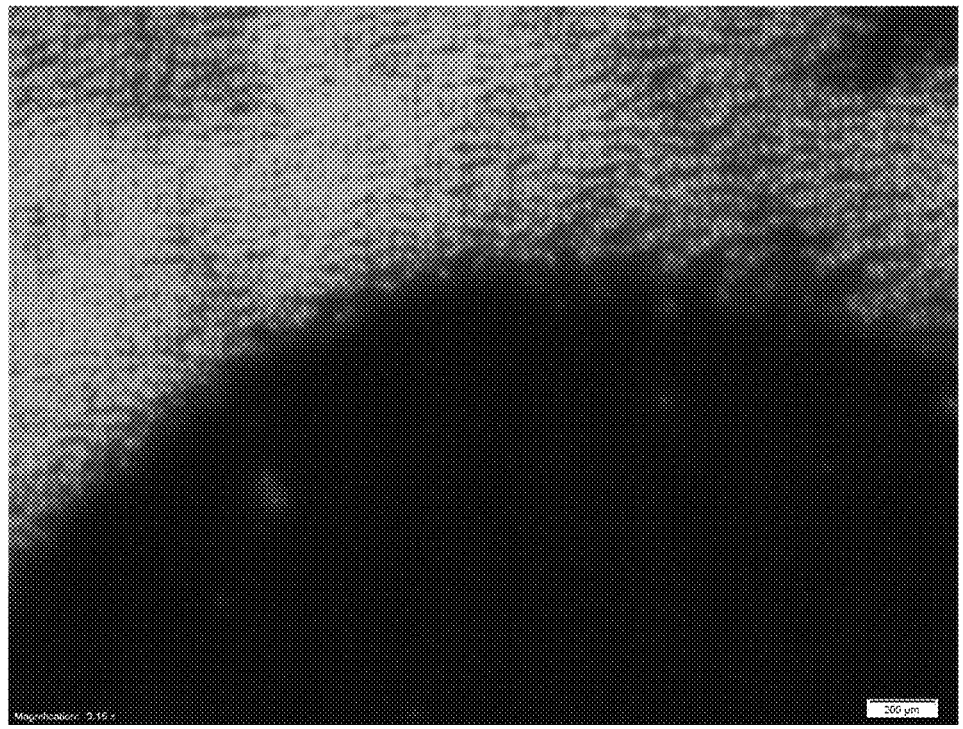
FIG. 11 shows a microscopic image of a patterned OLED panel according to an embodiment.

In an example device, a set of OLED panels were fabricated to display the images shown in FIG. 4. In this example, the patterns for each static OLED panel were formed using insulating dots as previously describe. The insulating dots were formed through photolithography patterning, and the insulator used was negative photoresist NR7-80P purchased from Futurrex Inc. This type of photoresist was chosen owing to its low thickness. At 3000 rpm spin rate for 40 seconds, the NR7-80P has a coating thickness of 70-90 nm. Advantages of a thin coating may include a less visible image when the device is at off state, and/or less moisture stored inside the photoresist that may affect device lifetime. The negative photoresist may be patterned through photolithography process. A conventional photo mask may be used, but may not be preferred due to its high cost. Instead, the images shown in FIG. 4 were printed onto a transparent plastic sheet and the printed sheet was attached to the anode-coated substrate to serve as a photo mask. Pictorico Ultra Premium OHP transparency film was used for the plastic sheet. Since a negative photoresist was used, the printed image were converted to a reverse tone to serve as the mask. The printed pattern on the plastic may be substantially reproduced onto the anode coated substrate. The resolution of the printer or the graphic software to generate the image may also be transferred to the image. An Epson Stylus PHOTO 1400 printer along Claria Hi-definition ink was used to print the image, which provides printing resolution of 2400 ppi. Therefore the image patterned through the plastic sheet may have a maximum resolution of 2400 ppi. However, the real resolution of the image is limited by the bitmap used to generate the image which in this example was 1200 ppi. A microscopic image of the device during illumination is shown in FIG. 11. The measured diameter of photoresist dot is in the average of 20-30 μm which agrees well with the estimated 1200 ppi resolution. In principle, the image resolution may be as high as the lowest among the printer, the graphic software to generate the image, or the photo lithography feature size.

The substrate used in this example is 6 inch×6 inch soda lime glass. The full process for fabricating the patterned OLED panel included: sputtering IZO through the anode shadow mask onto the glass substrate; patterning photoresist onto IZO coated substrate through photolithography, using the printed plastic sheet as mask; depositing organic and cathode layers through shadow masks using a vacuum thermal evaporation (VTE) process; and encapsulating the device. As mentioned above, shadow masks for anode, organic, and cathode may be preferred to be the same for all panels, so as to simplify the process and to reduce the cost. The image patterning may involve disposing insulator dots between anode and organic, or cathode and organic. The insulator dots may be disposed through a shadow mask using VTE process. More preferably, the insulator dots may be patterned through lithography using a low-cost disposable printed plastic sheet as photo mask.

Figure 12:
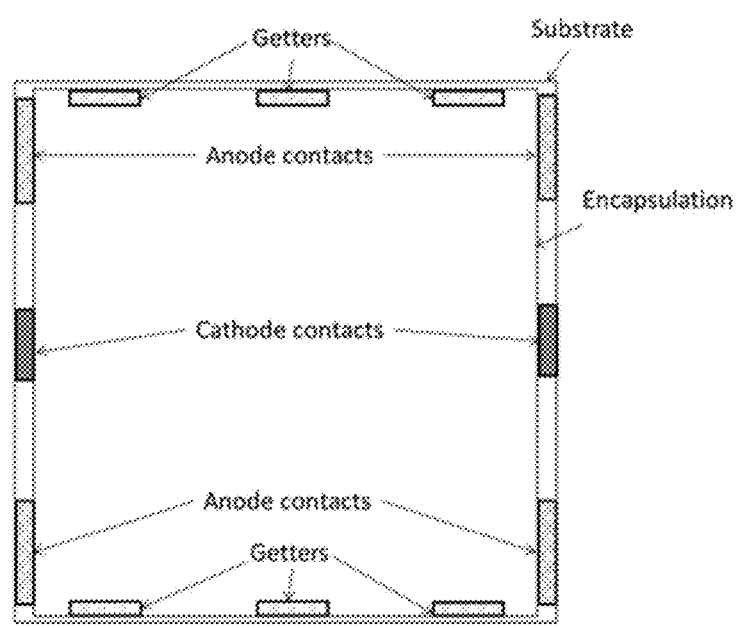
FIG. 12 shows an example arrangement of asymmetrical encapsulation used with a minimal bezel according to an embodiment.
Figure 13:
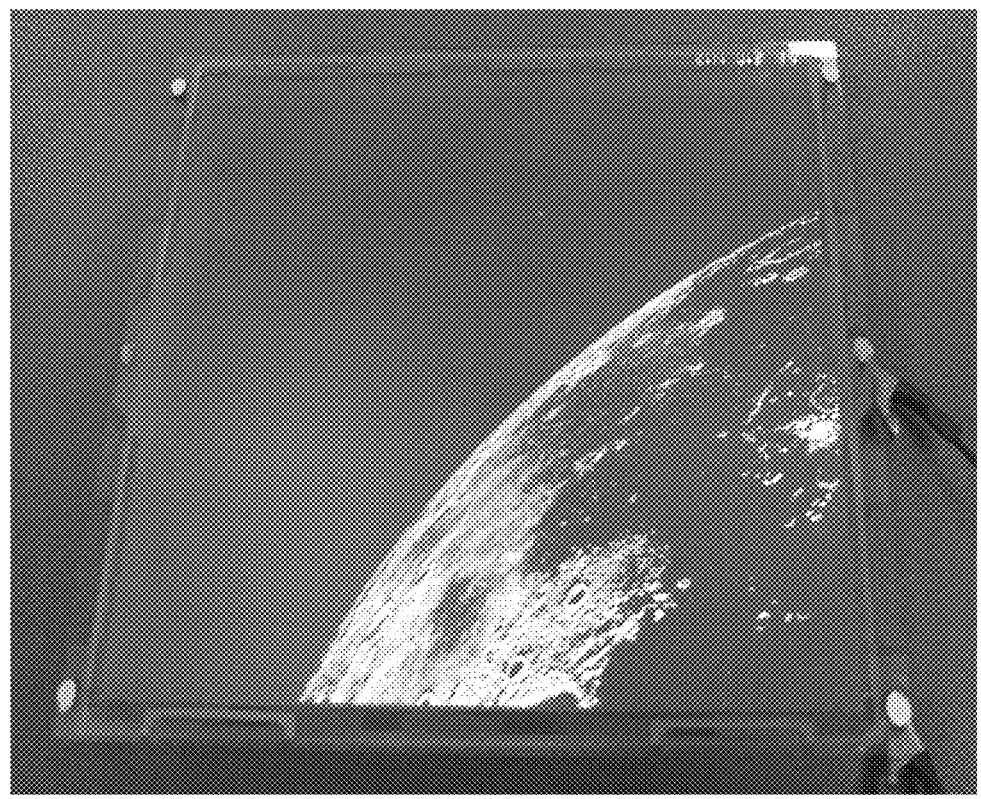
FIG. 13 shows a photo image of a completed patterned OLED panel according to an embodiment.

To minimize the bezel of each OLED panel so as to maximize the active area, asymmetrical encapsulation was used, as illustrated in FIG. 12. The substrate is a 6 inch×6 inch square i.e. 152 mm×152 mm, while the encapsulation foot print is 144 mm×150 mm, rectangular. The encapsulation may be narrower than the substrate in one dimension so as to leave the contacts exposed for making connection to external power source. The encapsulation may be close to the same footprint as substrate in the other direction such that getters may be implanted into the regions between active area outline and encapsulation outline. Getters may be used to absorb moisture so as to enhance device life time. Transparent getters may also be used. The contact sides of the panel may be further trimmed to minimize the bezel so long as the electrical connection may be applied on the contacts. The asymmetric encapsulation successfully embedded getters as well as saved bezel spacing. An image of one of the completed patterned OLED lighting panel at on state is shown in FIG. 13.

Alternatively, a large-size mother substrate may be used and all panels may be fabricated all at once. Printing process may be used to facilitate the fabrication. The panels may then be encapsulated and cut into a plurality of smaller panels as previously described. The advantage of forming plurality images onto individual panel may be to avoid the integration of bus lines, such that the image may be more appealing.

Figure 14:
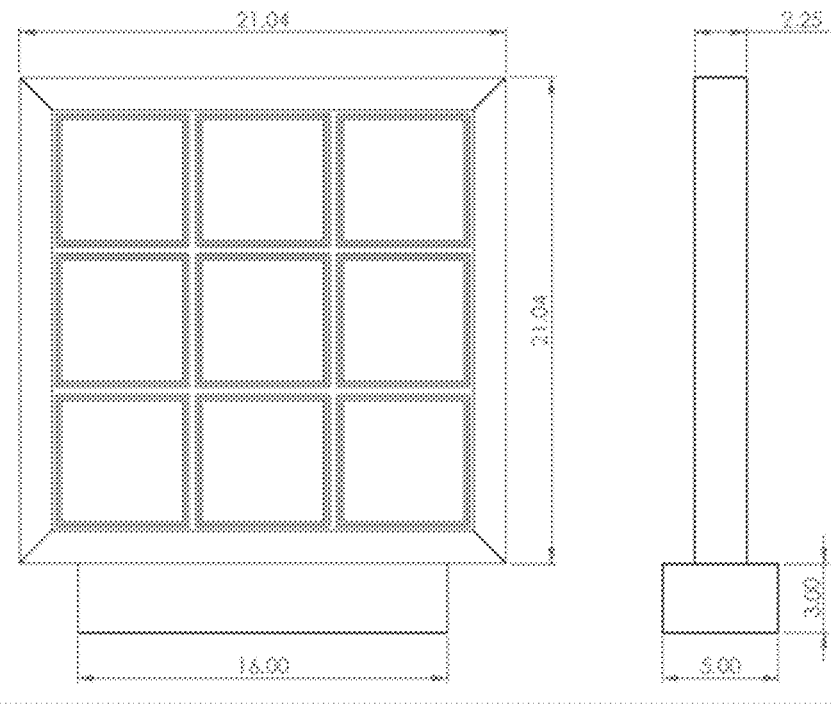
FIG. 14 example of an overall fixture according to an embodiment.
Figure 15:
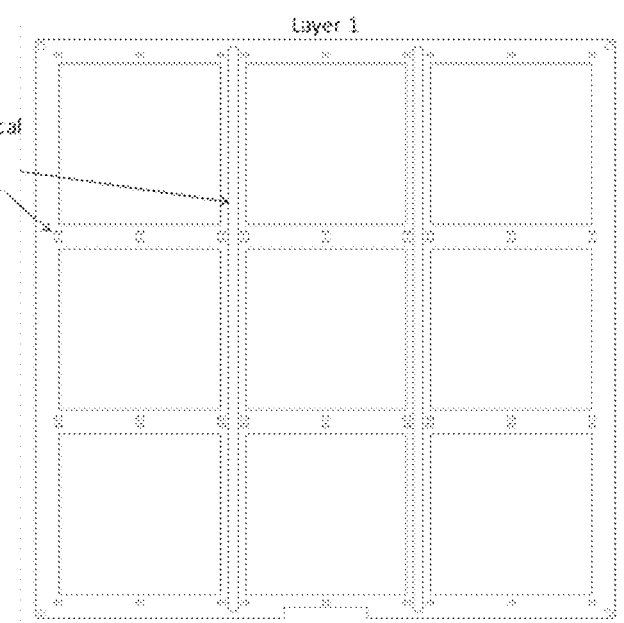

After completing the OLED panel fabrication, the panels were placed into a fixture as shown in FIG. 14. The example fixture forms a window looking grid pattern with a supporting base at the bottom. The fixture includes three individual layers, as shown in FIGS. 15-17. There are via holes and channels in Layers 1 and 2 (FIGS. 15 and 16, respectively) to provide electrical connection and/or wiring space. The overlay of three layers may form a solid window grid looking fixture on the outside, but still provide internal electrical connections.

Figure 18:
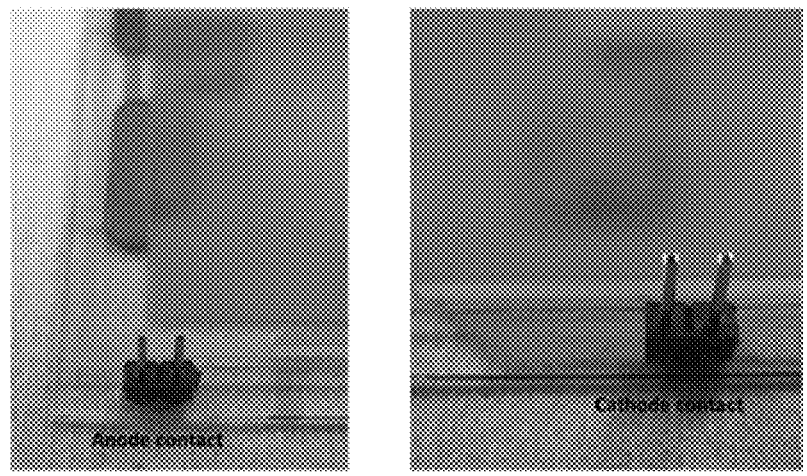
FIG. 18 shows a photo image of electric connectors soldered on the panel according to an embodiment.
Figure 19:
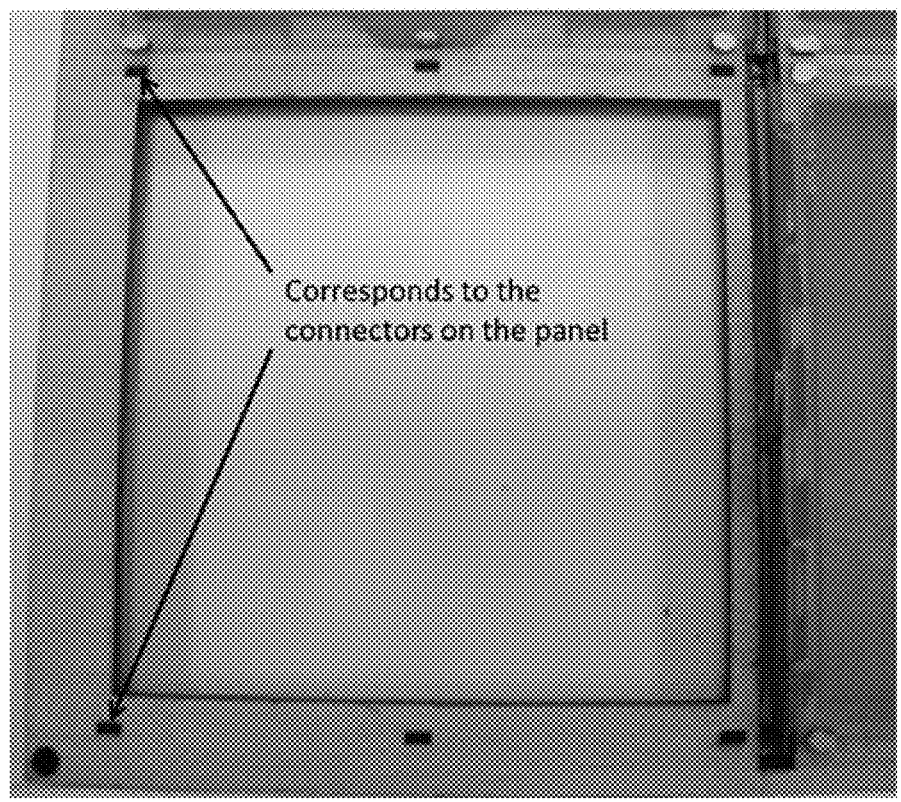
FIG. 19 shows a photo of receiving via holes on the fixture according to an embodiment.
Figure 20:
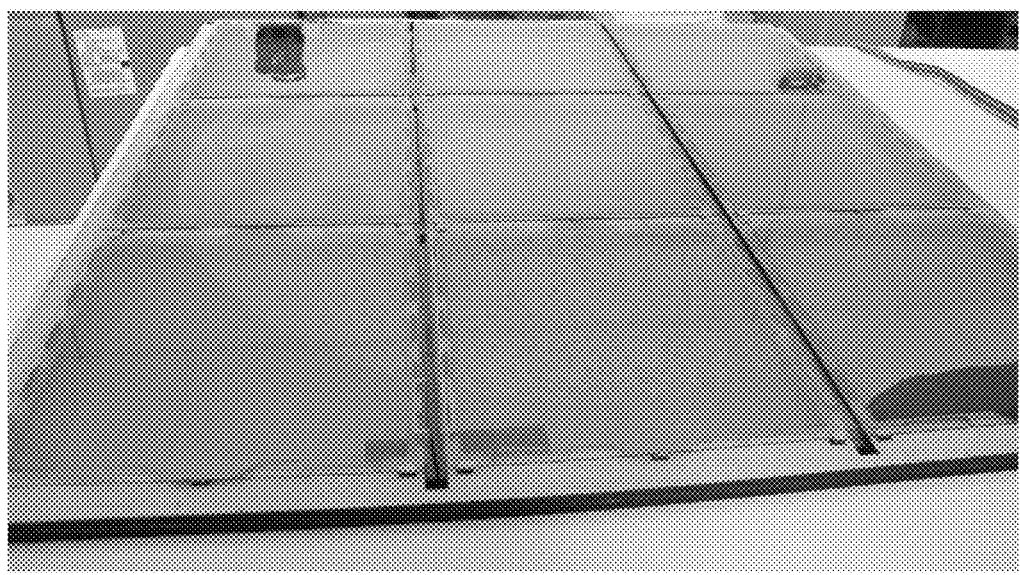
FIG. 20 shows a photo of panels fit into the fixture according to an embodiment.
Figure 21:
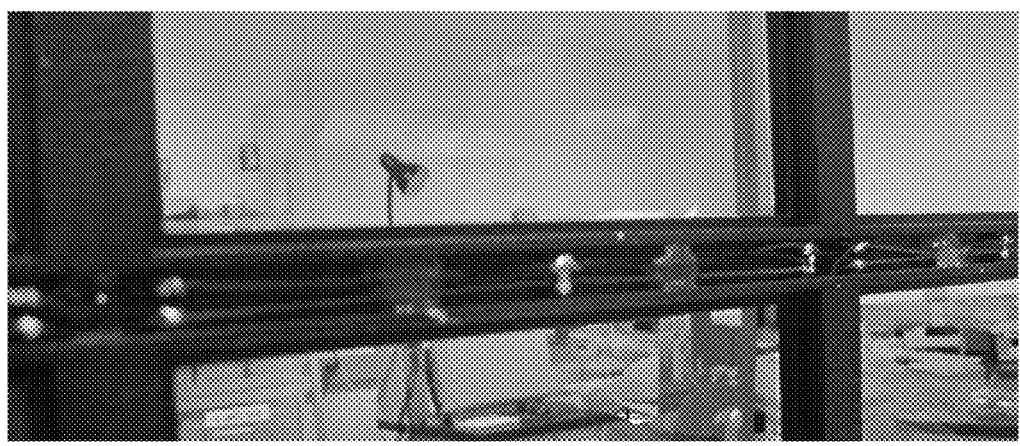
FIG. 21 shows a photo of wires buried in the channel in the fixture according to an embodiment.
Figure 22:
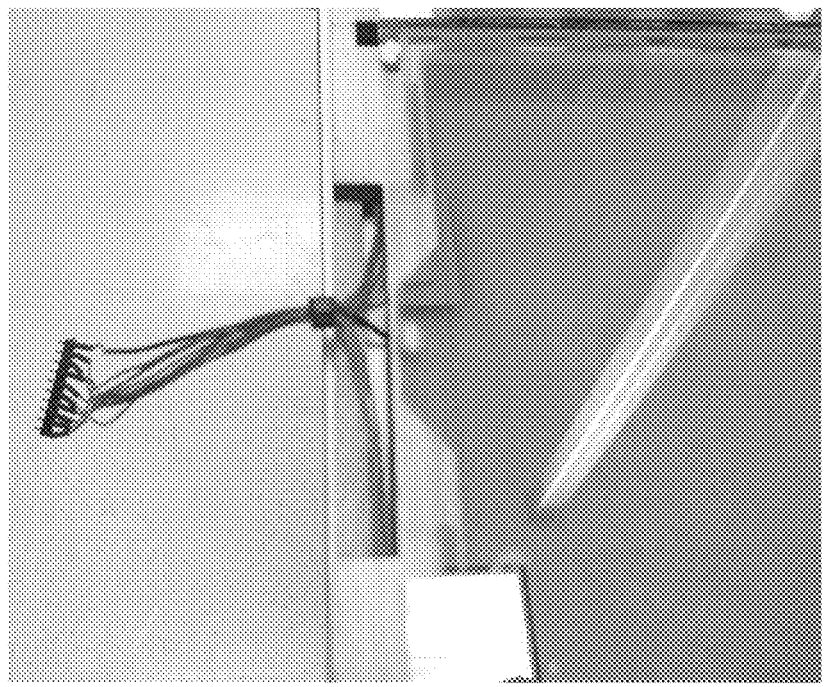
FIG. 22 shows a photo of a main connector at the bottom of a fixture according to an embodiment.
Figure 23:
FIG. 23 shows a photo of the backside of the fixture with all panels assembled according to an embodiment.

The electrode contacts of each panel were then soldered with electrical connectors, as seen in FIG. 18. The connectors used in this example are model GBC02SABN-M30 purchased from Sullins Connector Solutions. The connectors were glued to the electrode contacts on the panel through conductive epoxy. The conductive epoxy used here is TIGA Silver 901 purchased from Resin Technology Group. The connectors may be able to form electrical connection to the external power source through the fixture. The connectors may also make the panels easy to be plugged in and out. Alternatively, the connectors may also be attached to the fixture and the pins may be contacting the electrodes on the panel. In general, any means to make electrical connections between the panel and the external power source through the fixture may be used, such as wiring, soldering, applying conductive tapes, conductive rubbers, etc. The receiving connectors were embedded in the via holes on the fixture are shown in FIG. 19. The receiving connectors used here are model PPPC021LFBN-BC purchased from Sullins Connector Solutions. Each panel may be fit into the fixture through the receiver via holes, as seen in FIG. 20. Wires were soldered to the back of receiving via holes and extended to external power source or control device, shown in FIG. 21. Wires were buried inside the channels in the fixture and may be hidden after assembling. A main connector may be placed at the bottom of the fixture to collect all the wires and extend towards external power source or control device, as seen in FIG. 22. The main connector may be hidden inside the base portion of the fixture. A photo image of the backside of the fixture with all panels assembled is shown in FIG. 23.

Figure 24:
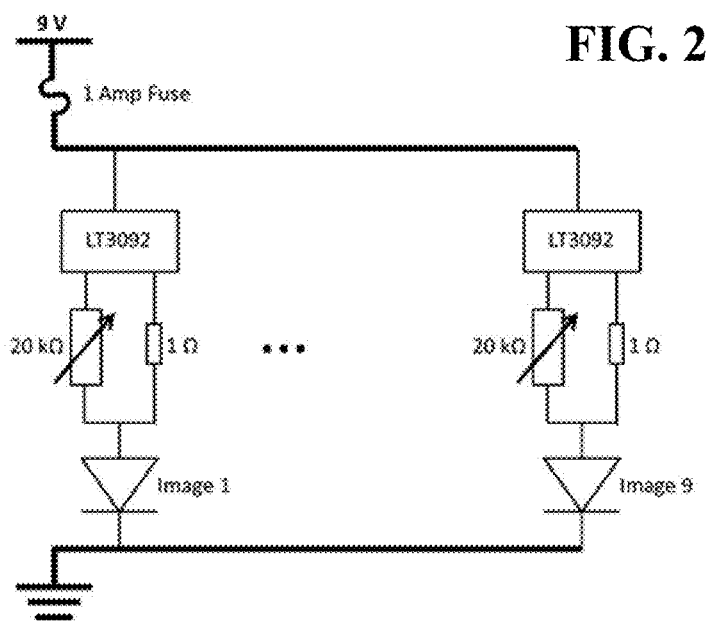
FIG. 24 shows an example circuit diagram for adjust driving condition for OLED panels according to an embodiment.
Figure 25A:
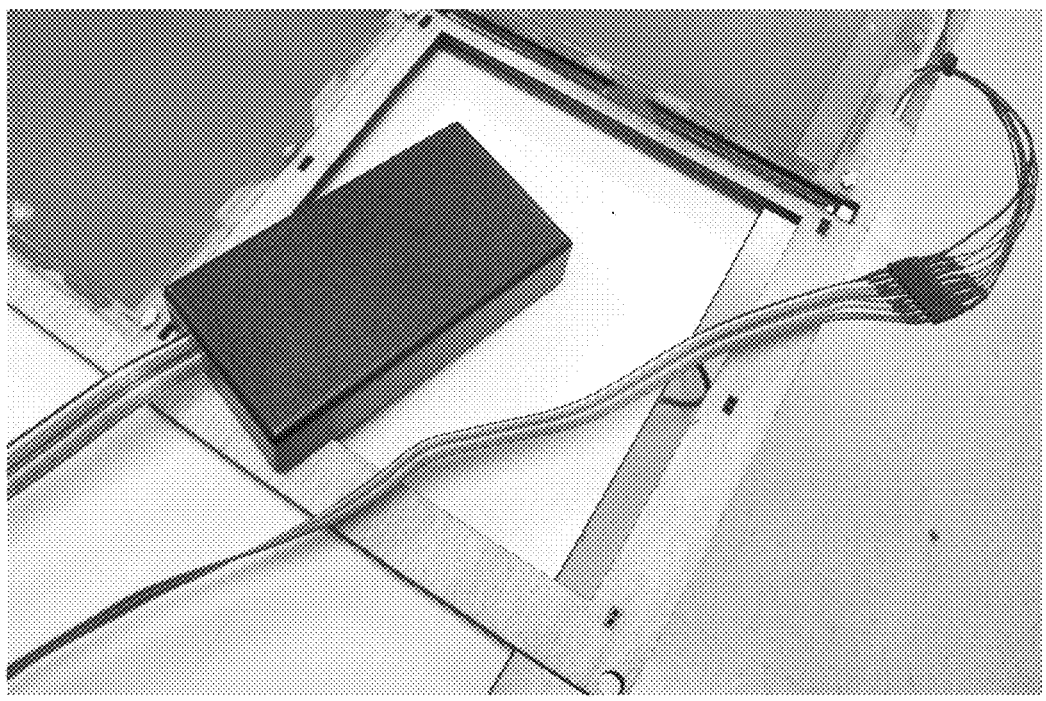
FIGS. 25a-25b show photos of the external control device to drive the panels according to an embodiment.
Figure 25B:
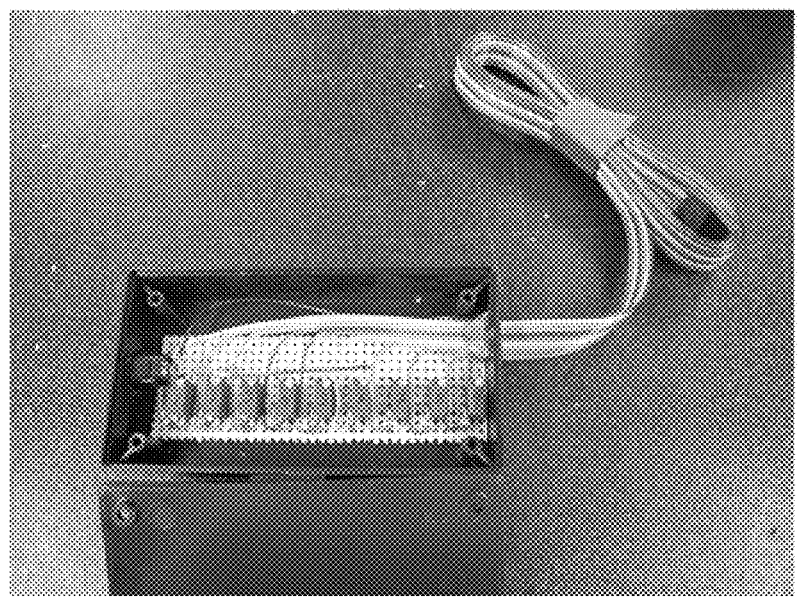

A set of OLED panels may have different active areas according to the various images to be displayed. This may introduce luminance or chromaticity variation among the panels when they are driven at the same condition, such as the same current, or same voltage, where the current density and hence the luminance or chromaticity may vary. This is not desired when displaying a unified image. As previously described, to ensure substantially same luminance and/or chromaticity, the panels may be addressed individually, such that the driving condition of each panel may be manipulated accordingly. The approach used here is to adjust the driving condition of each panel is extracted as a circuit diagram shown in FIG. 24. Each diode represents the OLED device, i.e. the panel, and two devices are shown as an example. All cathodes of the panels were bused together, but the anode of each panel was electrically connected to a 20 kΩ adjustable resistor shunted with a 1Ω resistor in series. Each pair of the resistors was then connected to a current source, LT3092, purchased from Linear Technology, in series. The resistors may be tuned individually to regulate the current flowing into the OLED panel from the current source, so as to maintain substantially the same brightness and/or chromaticity among the panels. The input ports of 9 current sources were connected to the 9V power in series with a 1 Amp fuse. The entire circuitry was integrated inside a control device. FIG. 25a shows a photo image of the external control device connected to the fixture with all panels assembled, and FIG. 25b shows the photo image of the circuit board inside the control device. Notably, any electrical means to individually adjust the driving conditions of the panels may be used here.

Figure 26:
FIG. 26 shows a device having multiple static OLED panels arranged to form a macro image according to an embodiment.

A photo image of the assembled macro-image OLED lighting system is shown in FIG. 26. The entire system includes 9 individual OLED lighting panels, emitting substantially white light. Each one of the OLED panels displays a portion of the originally moon image with high resolution. The lighting system uses transparent OLED devices, and may be used as a window.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

The invention claimed is:

1. A method, comprising:
   obtaining a static image;
   generating a plurality of static image portions of the static image, wherein the plurality of static image portions forms the entire static image, and at least two of the plurality of static image portions are non-identical;
   fabricating a plurality of static organic light emitting device (OLED) panels, wherein each static OLED panel in the plurality of static OLED panels is configured to display only a respective static image portion of the plurality of static image portions and comprises at least one pixel, and all pixels in each of the static OLED panels in the plurality of static OLED panels share a common anode and a common cathode; and
   placing the plurality of static OLED panels in a fixture in an arrangement configured to reproduce the entire static image
   wherein fabricating the plurality of static OLED panels further comprises, for at least one static OLED panel in the plurality of static OLED panels, disposing a plurality of insulating dots within the at least one static OLED panel to form the image portion.

2. The method of claim 1, wherein each static OLED panel in the plurality of static OLED panels displays the only a respective one of the plurality of static image portions when electrical power is applied to the static OLED panel.

3. The method of claim 1, wherein the fixture comprises a plurality of electrical connections, and each of the plurality of electrical connections is configured to provide electrical power to a respective one of the plurality of static OLED panels when the plurality of static OLED panels are disposed within the fixture.

4. The method of claim 1, wherein the step of fabricating the plurality of static OLED panels comprises, for each static OLED panel in the plurality of static OLED panels, depositing, on a substrate, a plurality of layers comprising an anode, a cathode, and an organic emissive layer.

5. The method of claim 4, further comprising using a common mask to fabricate at least one layer in the plurality of layers for each static OLED panel in the plurality of static OLED panels.

6. The method of claim 1, wherein the step of fabricating the plurality of static OLED panels further comprises:
   fabricating each static OLED panel in the plurality of static OLED panels on a common substrate; and
   separating the common substrate into a plurality of substrate portions, wherein each static OLED panel is disposed on a single substrate portion in the plurality of substrate portions.

7. The method of claim 1, wherein each static OLED panel in the plurality of static OLED panels has essentially the same shape and area.

8. The method of claim 1, wherein a first static OLED panel in the plurality of static OLED panels has a different area than a second static OLED panel in the plurality of static OLED panels.

9. The method of claim 1, wherein the step of disposing the plurality of insulating dots comprises patterning the insulating dots using a photolithographic technique.

10. The method of claim 1, wherein the step of disposing the plurality of insulating dots comprises applying a photo-resistive material to define a position of each of the plurality of insulating dots.

11. The method of claim 1, wherein the step of disposing the plurality of insulating dots comprises depositing the plurality of insulating dots via a printed plastic sheet.

12. The method of claim 1, wherein each static OLED panel in the plurality of static OLED panels is individually addressable via the fixture.

13. The method of claim 1, wherein at least one static OLED panel in the plurality of static OLED panels is at least 10% transparent when no electrical power is applied to the at least one static OLED panel.

14. The method of claim 1, wherein at least one static OLED panel in the plurality of static OLED panels is flexible.

15. The method of claim 1, further comprising, subsequent to placing each static OLED panel in the plurality of static OLED panels into the fixture, adjusting driving parameters for at least a first static OLED panel in the plurality of static OLED panels to achieve a uniform luminance with at least a second static OLED panel in the plurality of static OLED panels.

16. The method of claim 1, further comprising, subsequent to placing each static OLED panel in the plurality of static OLED panels in the fixture, adjusting driving parameters for at least a first static OLED panel in the plurality of static OLED panels to achieve a uniform chromaticity with at least a second static OLED panel in the plurality of static OLED panels.

17. The method of claim 1, wherein each of the static OLED panels in the plurality of static OLED panels is bezel-less.

18. A method, comprising:
   obtaining a static image;
   generating a plurality of static image portions of the static image, wherein the plurality of static image portions forms the entire static image, and at least two of the plurality of static image portions are non-identical;
   fabricating a plurality of static organic light emitting device (OLED) panels, wherein each static OLED panel in the plurality of static OLED panels is configured to display only a respective static image portion of the plurality of static image portions and comprises at least one pixel, and all pixels in each of the static OLED panels in the plurality of static OLED panels share a common anode and a common cathode; and placing the plurality of static OLED panels in a fixture in an arrangement configured to reproduce the entire static image, wherein the step of fabricating the plurality of static OLED panels further comprises, for at least one static OLED panel of the plurality of static OLED panels:

fabricating a plurality of pixels, wherein each pixel in the plurality of pixels is electrically coupled to a respective fuse in a plurality of fuses, and each fuse in the plurality of fuses is configured to limit current to the respective pixel, and applying energy to a fuse in the plurality of fuses to cause the fuse to be essentially non-conductive.

19. An organic light emitting device (OLED) system for displaying a primary static image, the system comprising:

a plurality of static OLED panels disposed within a common fixture, wherein each static OLED panel in the plurality of static OLED panels is configured to display only a static sub-image, all pixels within each static OLED panel in the plurality of static OLED panels share a common anode and a common cathode, and at least one static OLED panel in the plurality of static OLED panels is configured to display a different static sub-image than at least one other static OLED panel, wherein the static sub-images provide the entire primary static image when the entire plurality of static OLED panels is disposed within the common fixture, and wherein the plurality of static OLED panels further comprises, for at least one static OLED panel in the plurality of static OLED panels, a plurality of insulating dots within the at least one static OLED panel to form the image portion.

20. The system of claim 19, wherein each of the plurality of static OLED panels is individually addressable via the common fixture.

21. The system of claim 19, further comprising a controller configured to drive the plurality of static OLED panels at a uniform luminance.

22. An organic light emitting device (OLED) system for displaying a primary static image, the system comprising:

a plurality of static OLED panels disposed within a common fixture, wherein each static OLED panel in the plurality of static OLED panels is configured to display only a static sub-image, all pixels within each static OLED panel in the plurality of static OLED panels share a common anode and a common cathode, and at least one static OLED panel in the plurality of static OLED panels is configured to display a different static sub-image than at least one other static OLED panel, wherein the static sub-images provide the entire primary static image when the entire plurality of static OLED panels is disposed within the common fixture, and wherein the plurality of static OLED panels further comprises, for at least one static OLED panel of the plurality of static OLED panels:

a plurality of pixels, wherein each pixel in the plurality of pixels is electrically coupled to a respective fuse in a plurality of fuses, each fuse in the plurality of fuses is configured to limit current to the respective pixel, and energy has been applied to at least one of the fuses to cause the at least one fuse to be essentially non-conductive.

* * * * *